United States Patent
Li et al.

(10) Patent No.: US 8,780,606 B2
(45) Date of Patent: Jul. 15, 2014

(54) MEMRISTIVE DEVICE HAVING A POROUS DOPANT DIFFUSION ELEMENT

(75) Inventors: Zhiyong Li, Redwood City, CA (US); Fung Suong Ou, Houston, TX (US); William M. Tong, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 391 days.

(21) Appl. No.: 13/120,904

(22) PCT Filed: Dec. 23, 2008

(86) PCT No.: PCT/US2008/088225
§ 371 (c)(1),
(2), (4) Date: Mar. 24, 2011

(87) PCT Pub. No.: WO2010/074685
PCT Pub. Date: Jul. 1, 2010

(65) Prior Publication Data
US 2011/0176353 A1  Jul. 21, 2011

(51) Int. Cl.
*G11C 11/00* (2006.01)
*G11C 13/00* (2006.01)
*B82Y 10/00* (2011.01)
*G11C 11/56* (2006.01)
*G11C 13/02* (2006.01)
*H01L 45/00* (2006.01)

(52) U.S. Cl.
CPC ........ *G11C 13/0011* (2013.01); *G11C 13/0002* (2013.01); *B82Y 10/00* (2013.01); *G11C 11/56* (2013.01); *G11C 13/00* (2013.01); *G11C 13/0069* (2013.01); *G11C 13/02* (2013.01); *G11C 13/025* (2013.01); *G11C 2013/009* (2013.01); *G11C 2213/35* (2013.01); *G11C 2213/55* (2013.01); *G11C 2213/56* (2013.01); *H01L 45/1206* (2013.01); *H01L 45/1226* (2013.01); *H01L 45/08* (2013.01); *H01L 45/1233* (2013.01); *H01L 45/146* (2013.01)
USPC ......................................................... 365/148

(58) Field of Classification Search
CPC ........................ G11C 13/0011; G11C 13/0002
USPC .......................................................... 365/148
See application file for complete search history.

(56) References Cited

U.S. PATENT DOCUMENTS 7,203,789 B2    4/2007  Snider
8,129,704 B2 *  3/2012  Phatak et al. ..................... 257/2

(Continued)

FOREIGN PATENT DOCUMENTS

KR    1020080000358 A    1/2008

OTHER PUBLICATIONS

Wu, Wei; WO 2010/068221.*

(Continued)

*Primary Examiner* — Kretelia Graham (57) ABSTRACT

A memristive device includes: a first electrode; a second electrode; a memristive matrix interposed between the first electrode and the second electrode; a porous dopant diffusion element in physical contact with the memristive matrix and in proximity to the first electrode and the second electrode; and a first mobile dopant species which moves through the porous dopant diffusion element in response to a programming electrical field. A method for using a memristive device having a porous dopant diffusion element includes applying a voltage bias to generate a programming electrical field such that dopants move through the porous dopant diffusion element, thereby changing the distribution of dopants within a memristive matrix to form a first state; removing the voltage bias, the dopants being substantially immobile in the absence of the programming electrical field; and applying a reading energy to the memristive device to sense the first state.

19 Claims, 6 Drawing Sheets

(56) References Cited

U.S. PATENT DOCUMENTS

| | | | |
|---|---|---|---|
| 2003/0173612 A1* | 9/2003 | Krieger et al. | 257/304 |
| 2007/0267667 A1 | 11/2007 | Ufert | |
| 2008/0001172 A1* | 1/2008 | Karg et al. | 257/194 |
| 2008/0079029 A1* | 4/2008 | Williams | 257/213 |
| 2008/0090337 A1* | 4/2008 | Williams | 438/133 |
| 2011/0121359 A1* | 5/2011 | Yang et al. | 257/109 |
| 2011/0181352 A1* | 7/2011 | Kamins et al. | 327/583 |
| 2011/0182107 A1* | 7/2011 | Wu et al. | 365/148 |
| 2012/0075914 A1* | 3/2012 | Bateman et al. | 365/148 |

OTHER PUBLICATIONS

Sakamoto, Toshitsugu et al.; "Three Terminal Solid-Electrolyte Nanometer Switch"; Electron Devices Meeting. 2005, IEDM Technical Digest. IEEE International; Dec. 2005; 475-478; IEEE; USA.

Sakamoto, Toshitsugu et al.; "NanoBridge Technology for Reconfigurable LSI"; NEC Technical Journal; 2007; 72-75; vol. 2; No. 1.

Williams, R. S. How We Found the missing Memristor. IEEE Spectrum. Dec. 2008, vol. 45, No. 12, pp. 29-35.

\* cited by examiner

MEMRISTIVE DEVICE HAVING A POROUS DOPANT DIFFUSION ELEMENT

BACKGROUND

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field. This phenomenon is most strongly evident in nanometer scale devices and allows the device to "remember" past electrical conditions. However, nanoscale or microscale variations in materials used to create these electrical devices can significantly alter the dopant motion, making the device performance less predictable.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

There is a long felt but unfulfilled need for electrical components which retain a memory of past conditions. For example, these electrical components could be used to store data, calibrate circuits, or provide self programming, fuzzy logic, or neural learning capabilities. An example of such an electrical component may be a solid state memory device with high storage density, no power requirement for long term data retention, and fast access times. Other examples may include: switching devices, self programming circuit elements, memory devices capable of multi-state storage; solid state elements which can be used to tune circuits, analog neuronal computing devices which share fundamental functionalities with the human brain; and electronic devices for applying fuzzy logic processes.

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field, thereby retaining a memory of past electrical conditions.

Throughout the specification and appended claims the term "memristor" or "memristive" is used to describe a combination of an is insulating/semiconductor matrix and a dopant which exhibits dopant motion in the presence of a programming electrical field and long term dopant stability within the matrix when the programming field is removed. The memristive effect is most strongly evident in nanometer scale devices.

According to one illustrative embodiment, a memristive device may be a programmable resistor or "memristor." A memristor is the fourth fundamental circuit element, joining the capacitor, resistor, and inductor. The term "memristor" is derived from the combination of the two terms "memory" and "resistor." Thememristor has properties that cannot be duplicated by the combination of the other fundamental circuit elements. Unlike the other fundamental circuit elements, the memristor carries a memory of past electrical fields which have been applied. As described in U.S. Patent App. Pub. No. 20080079029, entitled "Multi-terminal Electrically Actuated Switch" to R. Stanley Williams, which is hereby incorporated in its entirety, memristor devices are based on dopant motion within a matrix material. Specifically, when an electrical field of sufficient magnitude is applied to a memristor, the dopants within the matrix material are displaced. When the electrical field is removed from the circuit, the displacement of the dopants allows the memristor to "remember" how much charge was previously applied and for how long. The motion of these dopants alters the electrical resistance of the memristor. The dopants remain in this displaced state over long periods of time, thereby retaining a memory of the past electrical fields applied to the device. Until another electrical field is applied to the memristor which has sufficient intensity or duration to induce dopant motion, the resistance characteristics of the memristor are stable.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1A:
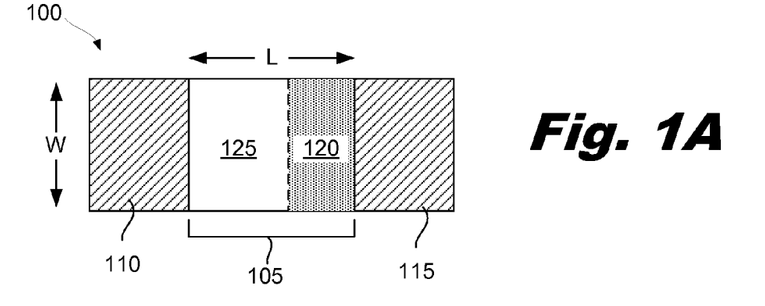
FIGS. 1A-1D are illustrative diagrams which show the fundamental operating principles of a memristive device, according to one embodiment of principles described herein.

FIG. 1A shows an illustrative two-terminal memristive switch (100). According to one embodiment, the two-terminal memristive switch (100) is comprised of a first electrode (110) and second electrode (115) which are in electrical and physical contact with the memristive matrix (105). The memristive matrix (105) is comprised of a primary material (125) which is not intentionally doped and a highly doped secondary region (120). Throughout the specification and appended claims, the term "memristive matrix" describes a thin film of a material that is electronically semiconducting or nominally electronically insulating and also a weakly ionic conductor. The memristive matrix is capable of transporting and hosting ions that act as dopants to control the flow of electrons through the switch. The basic mode of operation is to apply an electrical field (the drift field, which may exceed some threshold for enabling the motion of the ions in the memristive matrix) across the switch large enough to cause an ionic species to be transported within the memristive matrix via ionic transport. The ionic species are specifically chosen from those that act as electrical dopants for the memristive matrix, and thereby change the electrical conductivity of the matrix from low conductivity (i.e. not intentionally doped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the switch will remain in whatever state it is set for a reasonably long time, perhaps many years at room temperature. This ensures that the switch is nonvolatile, that is, that it holds its state after the drift field has been removed.

Applying a high voltage across the electrodes (110, 115) causes both electron current to flow and dopant motion through the matrix material, whereas at a low voltage bias the dopant motion is negligible, which allows the characteristics of the memristor to remain unchanged.

These dopants may be impurity atoms such as hydrogen or some other metal species, such as alkali or transition metals, which act as dopants for the matrix material. Additionally or alternatively, the dopants may be anion vacancies, which act as dopants within the matrix. It is also possible to drive anionic species into the matrix material, which will become electron acceptors (or hole donors). The matrix material may be a thin film (generally less than 50 nm thick), and is in many cases nanocrystalline, nanoporous, or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid (e.g., the time required for a diffusive process varies as the square of the distance covered, so the time to diffuse one nanometer is one-millionth the time required to diffuse one micrometer). Another advantage of nanometer scale memristive devices is that a large electrical field can be produced by a relatively small applied voltage. For example, a dopant may require an electrical field intensity of 100,000 volts per centimeter to move within the matrix. If the distance between two electrodes is 100 nanometers, a voltage bias of only 1 Volt will produce the required electrical field intensity.

There can be a variety of junctions within the memristive device where two dissimilar materials are joined to each other. For example, the memristive matrix can be contacted by electrodes which are made from metal or semiconductors. Additionally, within the matrix, regions with high concentrations of mobile dopants can contact regions which have been depleted of mobile dopants. In some cases, contact by dissimilar materials can deplete a doped material of free charge carriers, so in fact the doped material has a local net charge that depends on the identity of the dopants—positive in the case of donors and negative in the case of acceptors. These junctions electrically resemble Schottky barriers. The traditional description of a metal-semiconductor Schottky barrier is modified by the fact that the materials are structured at the nanometer scale, and so the structural and electrical properties are not averaged over the large distances over which the theory of semiconductor-metal contacts have been developed.

Conduction of electrons through the matrix material is via quantum mechanical tunneling of the electrons. When a semiconducting matrix material is essentially intrinsic, the tunneling barrier is high and wide, and thus the conductivity through the switch is low (OFF state). When a significant number of dopant species have been injected into the semiconductor, the width and perhaps the height of the tunneling barrier are diminished by the potential of the charged species. This results in an increase of the conductivity of the switch (ON state).

As noted above, the matrix material has certain properties that are useful in the practice of the present invention. One of these properties of the material is that it is a weakly ionic conductor. The definition of a weakly ionic conductor is based on the application for which a switch is designed. The mobility and the diffusion constant for a species in a lattice are directly proportional to one another, via the "Einstein relation". Thus, if the mobility of ionized species in a lattice is very high, so is the diffusion constant. In general, it is desired for a switching device to stay in a particular state, ON or OFF, for an amount of time that may range from a fraction of a second to years, depending on the application. Thus, the diffusion constant for such a device is, in an embodiment, low enough to ensure the desired level of stability, to avoid inadvertently turning the device from ON to OFF or vice versa via ionized-species diffusion, rather than by intentionally setting the state of the switch with a voltage pulse. Therefore, a "weakly ionic conductor" is one in which the ion mobility, and thus the diffusion constant, is small enough to ensure the stability of the ON or OFF state of the device for as long as necessary under the desired conditions (e.g., the device does not change state because of diffusion of the dopants). "Strongly ionic conductors" would have large ionized species mobilities and thus would not be stable against diffusion.

According to the illustrative embodiment in FIG. 1A, the memristive matrix (105) may be initially comprised of two separate materials or layers. A first insulating layer (125) has very few dopants and prevents electrical current from flowing between the two electrodes (110, 115). A second highly doped layer (120) is conductive and serves as a source of dopants which can be moved into the first insulating layer (125) to change the overall electrical conductivity of the memristive matrix (105). Consequently, in the configuration illustrated in FIG. 1A, the memristive switch (100) is open.

According to one illustrative embodiment, the first insulating layer (125) is comprised of intrinsic titanium dioxide ($TiO_2$). Intrinsic titanium dioxide ($TiO_2$) is an insulator, having a resistivity of approximately $10^{12}$ ohms-centimeters at 25° C. The second highly doped layer (120) is comprised of doped titanium dioxide. By way of example and not limitation, dopants which may be compatible with titanium dioxide include oxygen vacancies, beryllium, magnesium, and calcium. Even relatively low concentrations of dopants result in a large increase of the electrical conductivity within the titanium dioxide.

Additionally, the dopants move within the titanium dioxide under the influence of electrical fields. For example, electrical fields between 10,000 volts per centimeter and 100,000 volts per centimeter may be sufficient to physically relocate a particular dopant species.

The memristive matrix (105) has a length of "L" and a width of "W" as shown in FIG. 1A. For purposes of illustration only, assume that the length "L" is 100 nanometers and the width "W" is approximately 50 nanometers. Consequently, to apply an electrical field of 100,000 volts/centimeter across the memristive material (105), a voltage bias of 1 volt would be applied across the electrodes (110, 115).

The dopants may originate from a variety of sources. The IC matrix material may be initially formed with a number of dopants distributed throughout the matrix. A programming electrical field can then be used to displace the dopant to form intrinsic regions and doped regions within the matrix. In other embodiments, the matrix material may be deposited in its intrinsic form. A sacrificial layer is then deposited onto the intrinsic material which provides the dopants by chemically reacting with the intrinsic matrix.

In an alternative embodiment, the matrix may be made with an intrinsic layer and a separate doped layer. The application of a programming electrical field to the memristive device then allows the dopants to be distributed as desired throughout the matrix. Additionally or alternatively, the dopant source particles or layers may be included in the memristive device. The dopant source particles or layers may act as a source of dopants in a variety of ways. For example, the dopant source particles or layers may have the ability to generate large numbers of dopants under the influence of an external field of high enough strength. Typically, this electrical field is much higher than the programming electrical field. Additionally, a passivation layer may be formed over a memristive device to prevent atmospheric oxygen or other contaminants from chemically altering the composition of the memristive device.

The electrodes (110, 115) may be constructed from a variety of conducting materials, including but not limited to: metals, metal alloys, highly doped semiconductors, composite materials, nanostructured materials, or other suitable materials. According to one illustrative embodiment, the electrodes are formed from platinum.

Figure 1B:
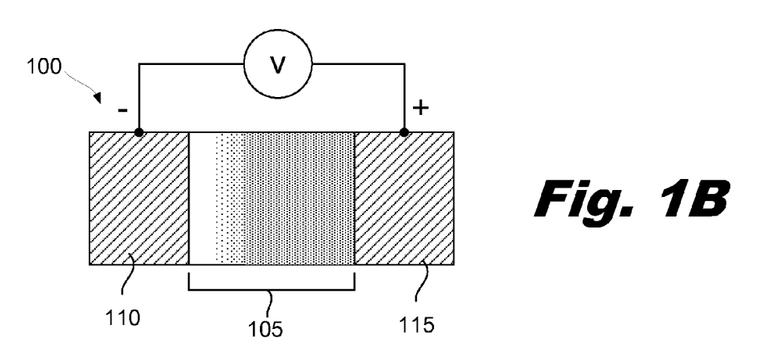

FIG. 1B illustrates the movement of the dopants from the highly doped region (120) into the intrinsic region (125) as a result of an applied electrical field. The polarity and voltage difference which is applied across the memristive matrix (105) may vary according to a variety of factors including, but not limited to: material properties, geometry, dopant species, temperature, and other factors. Where titanium dioxide is used as the matrix, the beryllium dopants have a positive charge, consequently a positive voltage is applied to the right electrode (115) to repulse the beryllium atoms and drive them toward the left electrode (110). A negative voltage may also be applied to the left electrode (110) to further increase the electrical field and draw the beryllium atoms toward the left electrode (110). Similarly, oxygen vacancy in titanium dioxide also has a positive charge and will behave similarly to beryllium in an applied electrical field.

Figure 1C:
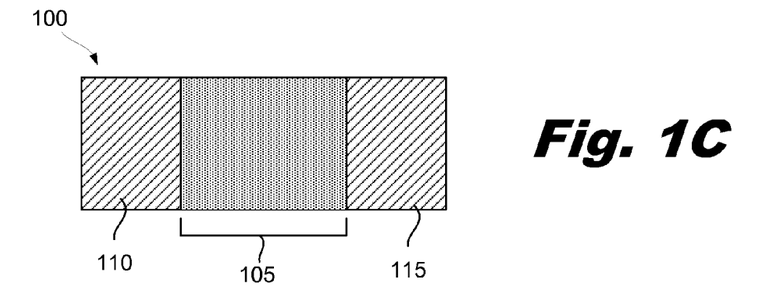

FIG. 1C illustrates the memristive switch in the fully "ON" is position, with the dopants fully distributed throughout the memristive matrix (105). The left and right electrodes (110, 115) are electrically connected and can pass lower voltage electrical signals through the memristive matrix (105). As discussed above, the location and distribution of the dopants can remain stable over long periods of time or until another programming voltage is applied. The memristive matrix (105) is not a perfect conductor and still interposes an electrical resistance between the two electrodes (110, 115) in the fully "ON" state. This electrical resistance may be influenced by a variety of factors, including, but not limited to the geometry of the memristive matrix and the electrodes, the dopant concentration, the distribution of the dopants throughout the memristive matrix, the species of dopant, the electrical characteristics of the matrix material, the temperature of the device, and other factors.

Figure 1D:
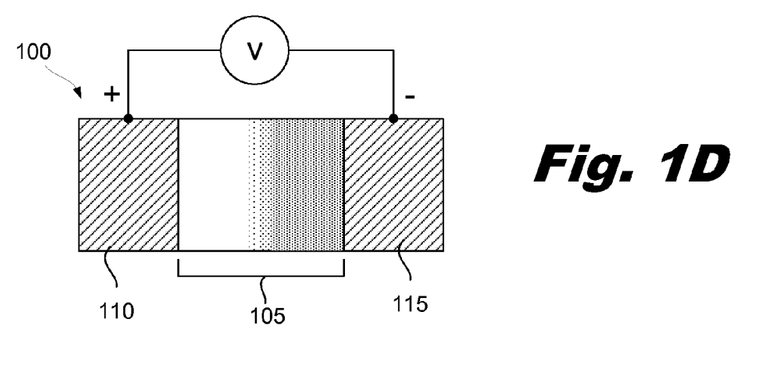

FIG. 1D illustrates the application of a programming voltage to the memristive switch (100). In this case, the purpose of the programming voltage is to return the memristive switch (100) to the fully "OFF" configuration similar to that illustrated in FIG. 1A. Consequently, the applied programming voltage has an opposite polarity from that illustrated in FIG. 1B. A positive voltage is applied to the left electrode (110) and negative voltage is applied to the right electrode (115), thereby driving the dopants toward the right electrode (115). This returns the left most portion of the memristive matrix (105) to its intrinsic and insulating state. The memristive switch (100) is then in a fully "OFF" configuration.

The transition from the fully "OFF" to fully "ON" configuration or visa versa, is not instantaneous, but can have a number of intermediate states in which the memristive matrix (105) acts as a finite resistance between the two electrodes (110, 115). These intermediate states may be produced by varying the programming voltage applied across the two electrodes (110, 115) and/or varying the time period during which the programming voltage is applied.

Figure 2:
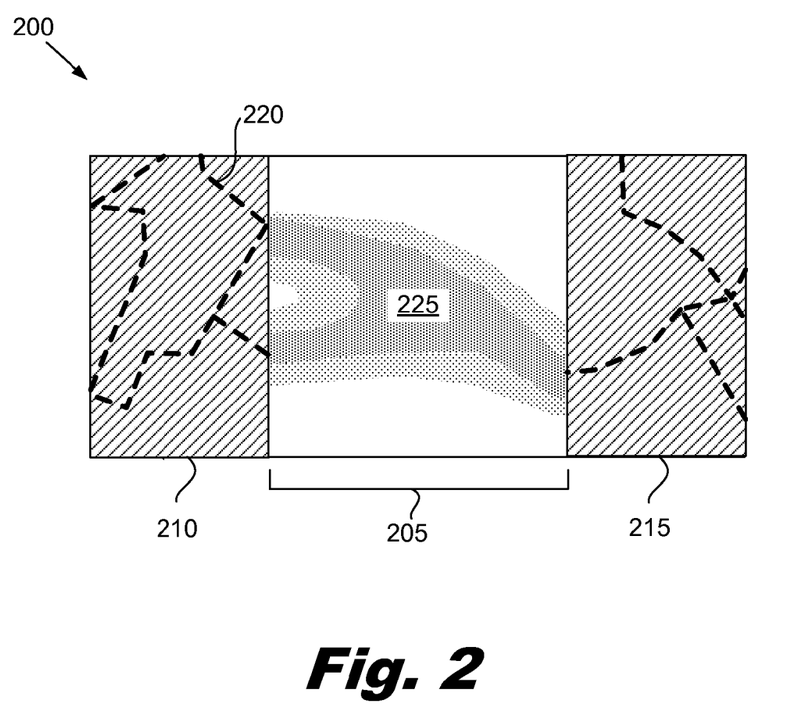
FIG. 2 is a diagram of an illustrative memristive device showing uneven dopant distribution due to nanoscale material variations, according to principles described herein.

FIG. 2 is a diagram of an illustrative memristive device (200) showing uneven dopant distribution due to nanoscale material variations within the memristive device (200). Memristive devices generally have dimensions on the order of 5 to 100 nanometers, with typical dimensions in the current generation of devices being between 10 and 50 nanometers. Because of the very small scale of the memristive devices, material variations within the memristive device, such as grain boundaries within metal electrodes or individual atom placement becomes important. In larger devices, there are many such variations but they have a relatively small effect on the performance of the device because of their statistical distribution and the distances over which the electrical fields and currents act. The large numbers of variations tend to average out over large areas and distances, making the performance of large scale devices relatively predictable and repeatable.

Memristor devices are necessarily small because of the requirement that the dopants move relatively rapidly throughout the memristive matrix. As discussed above, the amount of time required to drift enough dopants into or out of a local region of the memristive matrix varies as the square of the distance covered. For example, the time to diffuse a dopant one nanometer is one-millionth the time required to diffuse one micrometer.

Without subscribing to any particular theory, it appears that microscale or nanoscale variations within the materials which make up the memristor device can produce significant deviation in performance of memristive devices. For example, grain structures within electrodes can have a wide variety of variations on the order of 10 to 50 nanometers. The grain sizes within electrodes can be controlled to some degree by material and deposition processes. For example, the electrodes can be formed using processes which tend to produce highly amorphous conducting materials. However, the potential for significant variation in at least some of the electrodes with a memristive architecture remains fairly high.

In FIG. 2, an illustrative memristive device (200) is made up of a memristive matrix (205), and left and right electrodes (210, 215) which are physically and electrically connected to the memristive matrix (205). The electrodes (210, 215) contain grain boundaries (220). Metals or other conductive materials typically are made up of a number of small crystals or grains. Within a given grain, there is a regular and orderly arrangement of atoms. However, this regular arrangement is disrupted by misalignments in the crystal lattice. These misalignments are grain boundaries which define a transition from one grain to another.

The nanoscale behavior of the material can be different at the grain boundaries than within a crystal. For example, when a voltage is applied to an electrode, the crystalline material may disrupt the potential gradient of the electrical field. This may occur because a grain boundary may produce a sharp discontinuity in the electrode geometry, thereby significantly increasing the local potential gradient. A variety of other variations may result because of variations in the material properties of the electrode or memristive matrix. For example, dopants may preferentially diffuse into or out of grain boundaries. Additionally, the electrical conductivity at grain boundaries may be more or less than within the surrounding crystalline material.

FIG. 2 illustrates a possible dopant distribution (225) which has been influenced by higher electrical gradients generated at grain boundaries (220). The left electrode (210) has two grain boundaries that intersect the interface between the electrode surface and the memristive matrix (225). The right electrode (215) has a single grain boundary which intersects the interface (225). Without subscribing to any particular theory, disruption in the distribution of the dopants could be caused by variations in the electrical field. As discussed above, the grain boundaries may focus the electrical gradient and cause locally higher concentrations of dopants.

A non-uniform distribution of dopants within a memristive matrix can limit the functionality of a memristive device in a number of ways. In the example shown in FIG. 2, the memristive device (200) is in its "ON" state, but due to the non-uniform distribution of dopants, the conductive channel within the memristive device is smaller that it otherwise could be. This will lead to more difficulty in distinguishing between an "ON" state and an "OFF" state. Additionally, the memristive device (200) may have a lower than normal threshold voltage for dopant motion due to the concentration of the potential gradient at the grain boundaries. This could lead to undesirable dopant motion during read cycles.

One technique which has been used to mitigate the effects of grain boundary and other variations is to roughen the surface of the electrodes to introduce finer scale irregularities. In theory, introducing more and smaller variations could provide better overall uniformity within the device. However, creating uniform nanoscale and sub-nanoscale roughness can be challenging. As the size of nanoscale devices shrinks, the area over which the roughness can be formed is reduced and the uniformity of the roughness can become more critical. At scales' of one to ten nanometers, the placement of individual atoms may be significant.

Grain boundaries are only one example of material or other variations which may influence the performance of a memristive device. Other variations, such as atomic placement, impurity and dopant location, and other variations could also play a role in memristive devices.

Figure 3:
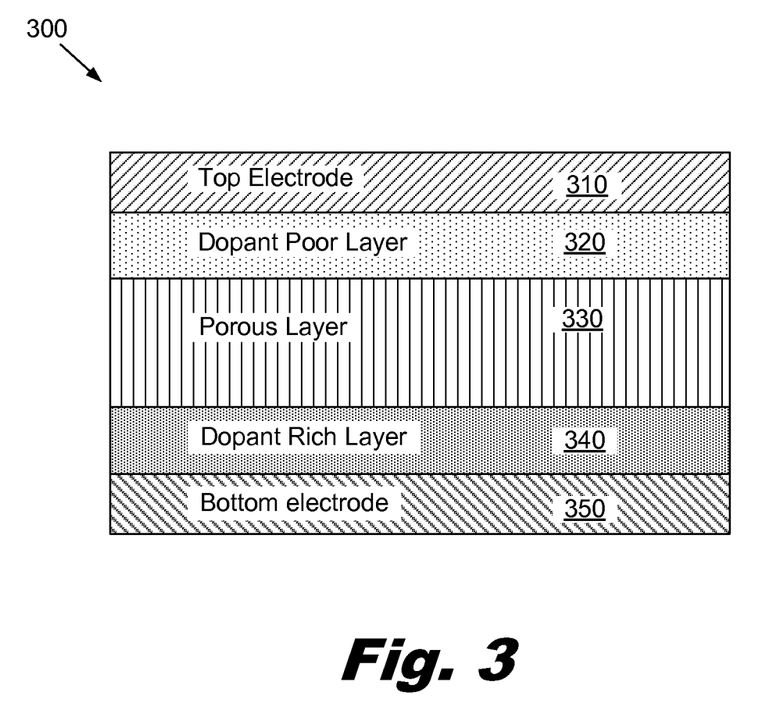
FIG. 3 is cross-sectional diagram of an illustrative memristive device which incorporates a porous layer, according to principles described herein.

FIG. 3 is cross-sectional diagram of an illustrative memristive device (300) which incorporates a porous layer (330) which promotes uniform dopant diffusion. According to one illustrative embodiment, the memristive device (300) includes a top electrode (310) and a bottom electrode (350). The memristive matrix is divided into two layers, a dopant poor layer (320) which has a low electrical conductivity and a dopant rich layer (340) which has a much higher electrical conductivity. The porous layer (330) is sandwiched between the dopant poor layer (320) and the dopant rich layer (340).

The porous layer (330) may be constructed from a variety of materials, including but not limited to, a zeolite, nanotubes, porous titanium dioxide, porous silica, porous carbon, or porous alumina. Each of these materials form multiple uniform channels between the dopant rich layer and the dopant poor layer. The dopants can pass through the channels to reach the opposite side of the porous layer (330).

The porous layer (330) promotes an even diffusion of the dopants by creating a uniform barrier through which the dopants must pass.

For example, one type of zeolite is an aluminosilicate structure which has a nanoporous structure, with regularly spaced pores that are on the order of 2 nanometers in diameter. The family of zeolite materials includes almost one hundred natural and synthetic species. For example, zeolite materials include is analcime, chabazite, heulandite series, natrolite, phillipsite, and stilbite. In some circumstances, it may be preferable to use synthetic zeolites. Synthetic zeolites can be manufactured in a uniform, phase-pure state. Additionally, synthetic processes allow for the creation of desirable zeolite structures which do not appear in nature.

According to one illustrative embodiment, carbon nanotube and/or inorganic nanotubes may also be used as a porous layer (330). Carbon nanotubes are allotropes of carbon that belong to the fullerene structural family. Carbon nanotubes typically have a diameter on the order of a few nanometers and a length that is many times the diameter. An array or bundle of carbon nanotubes could be formed with the major axis of the tubes oriented in the desired direction of dopant motion. The dopants could then pass through the carbon nanotubes and into the memristive matrix in a controlled and uniform fashion.

Inorganic nanotubes could also be used within the porous layer (330). Inorganic nanotubes are often composed of metal oxides and are morphologically similar to a carbon nanotube. By way of example and not limitation, these inorganic nanotubes could potentially be formed from tungsten disulfide, vanadium oxide, manganese oxide, boron nitride, copper, bismuth, silicon, titanium dioxide and other materials.

In memristive devices which use a titanium dioxide matrix, there could be a number of advantages to using an inorganic nanotube made of titanium dioxide. One advantage of using titanium dioxide nanotubes is that the entire memristive matrix would have the same diffusion constant. Another advantage may be that the manufacturing process could be simplified. According to one illustrative embodiment, a layer of titanium dioxide may be deposited on a bottom electrode. A layer of pure titanium may then be is deposited over the titanium dioxide. The pure titanium may then be fabricated into titanium oxide nanotubes by anodic oxidation. For example, a weak aqueous solution of hydrofluoric acid (0.5 to 3.5 percent) may be used. Additionally or alternatively, a variety of other electrolyte solutions may be used. For example, potassium fluoride/sodium fluoride electrolytes, is hydrofluoric/sulfuric acid mixtures, chromic acid, sodium fluoride/sulfuric acid mixtures and other electrolytes may be used in the anodic oxidization process. Using this process, the titanium oxide nanotubes may be manufactured with both ends open and in high density arrays. The anodization voltage or current may be controlled to produce the desired diameter within the titanium oxide nanotubes. To allow the nanotube to be open at both ends, the pure titanium parent material may be deposited with a predetermined thickness, such that the titanium parent material was entirely consumed in the anodization process. Additionally, a number of other processes may be used, including electrochemical lithography, photo-electrochemical etching, sol-gel processing, hydrothermal synthesis, template synthesis and others.

Figure 4:
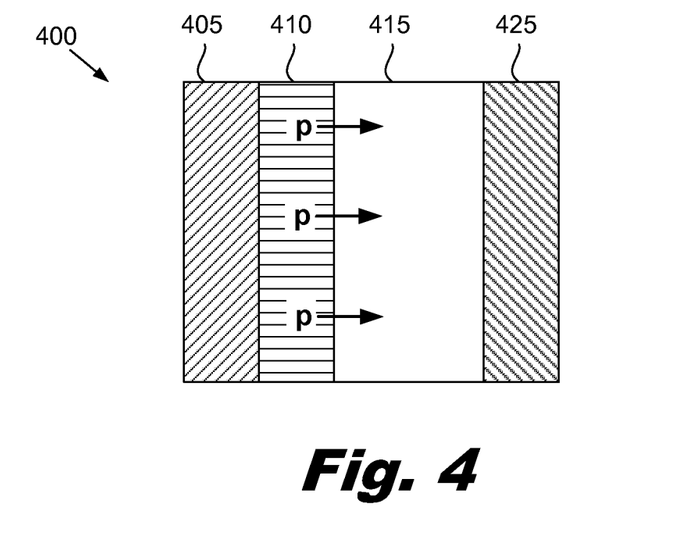
FIG. 4 is a cross-sectional diagram of an illustrative memristive device which incorporates a porous layer, according to principles described herein.

FIG. 4 is a cross-sectional diagram of an illustrative memristive device (400) which incorporates a porous layer (410) adjacent to a left electrode (405). A memristive matrix (415) is interposed between the porous layer (410) and the right electrode (425). In this embodiment, the porous layer (410) is illustrated as the source of a p-type dopant, which diffuses out of the porous layer (410) and into the memristive matrix (415).

As discussed above, a variety of porous materials could be used as a reservoir for dopants. The porous materials have large surface areas and relatively enclosed volumes in which dopants may be placed. However, in a two electrode embodiment of a memristive device, the porous material that is electrically conductive may be particularly useful. Following the diffusion of dopant into the memristive matrix (415), the current can then flow from a first electrode (405), through the porous layer (410) and matrix (415) and into the opposing electrode (425). Carbon nanotubes have a high electrical conductivity along their major axis and could be particularly useful in this application. In some embodiments, a conductive porous layer could be used as one or more of the electrodes. Carbon nanotubes are not particularly conductive across their diameters and may require a backing of conductive material as shown in FIG. 4 to effectively energize the entire array of nanotubes. Other porous materials may have more uniform conduction properties and could be used as an electrode without backing by a conductive layer.

By including an electrode formed from a porous layer or interposing a porous layer between an electrode and the memristive matrix, more uniform diffusion of the dopants into the memristive matrix occurs. This provides the memristive device with a more uniformly conductive state. Further, the memristive device could be reconfigured to drive the dopants back into the porous material to return to the "OFF" or non-conducting state.

In some illustrative embodiments, the memristive device (400) may have two or more dopant species that move within the memristive matrix (415). Each of the dopant species may have unique characteristics, including but not limited to a potential gradient threshold which must be exceeded before the dopant species moves within the matrix and a diffusion speed within the matrix. By using multiple dopant species, the memristive device can exhibit multiple states. This can allow a single memristive device to capture multiple state variables and act as a more versatile and powerful element within a computing network. The porous layer (410) serves as an ideal method of capturing and holding the various dopant species. Further, the porous layer (410) could act as a species specific barrier or filter. For example, the pore size of the porous layer could be tuned such that one dopant species can easily pass through the porous layer (410) while a second dopant species may only pass through slowly. Additionally or alternatively, the porous layer (410) may be designed as a molecular sieve, such that one or more dopant species is unable to pass through the porous layer (410), while a second species can pass through the porous layer (410).

Figure 5:
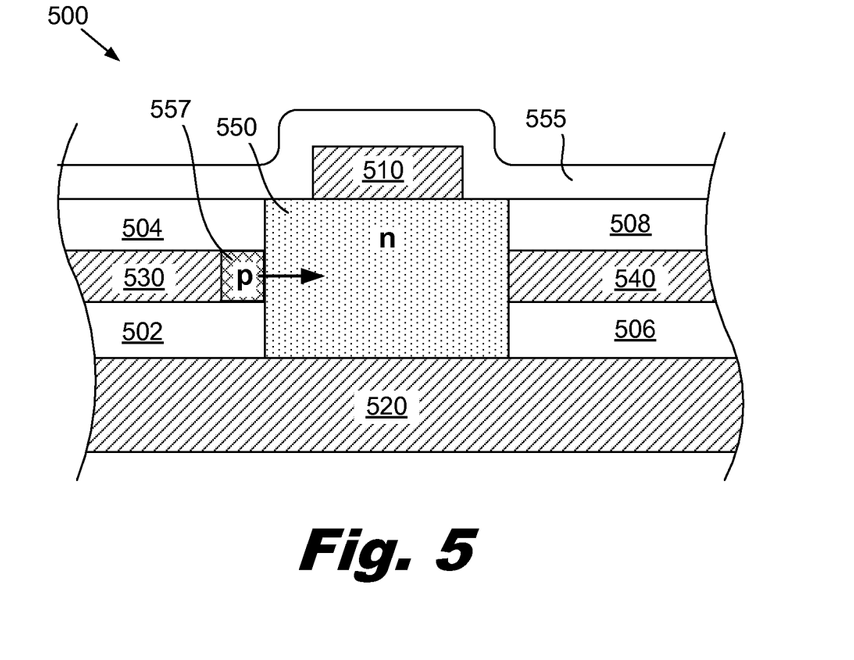
FIG. 5 is a cross-sectional diagram of a multi-electrode memristive device which incorporates a porous layer which acts as a reservoir for one or more dopant species, according to one embodiment of principles described herein.

FIG. 5 is a cross-sectional diagram of a multi-electrode memristive device (500). The memristive device (500) includes a memristive matrix (550) which has been formed on a bottom electrode (520). Lower insulating layers (502, 506) are also formed on the bottom electrode (520). These lower insulating layers (502, 506) electrically separate the left electrode (530) and the right electrode (540) from the bottom electrode (520). Additional insulating layers (504, 508) are formed on top of the left and right electrodes (530, 540). A top electrode (510) is formed above the memristive matrix (550). According to one embodiment, a passivation layer (555) is formed over the memristive transistor (500) to prevent the entry of contaminates or unwanted dopants.

According to one illustrative embodiment, an n-dopant is uniformly dispersed within the memristive matrix (550) and a p-dopant is contained within a porous reservoir (557). The porous reservoir (557) is proximate to the left electrode (530) and contains p-type dopants. To configure the memristive device (500) into a transistor, a programming voltage is applied across the left and right electrodes (530, 540), which moves the p-dopants out of the porous reservoir (557) and into the n-doped memristive matrix (550). The p-doped region is extended across the memristive matrix (550) to form an NPN junction. In the transistor operation, the right electrode (540) serves as the base electrode and the top and bottom electrodes (510, 520) serve as one of the emitter or collector. A small application of a control voltage to the right (base) electrode (540) modulates the current flow between the top and bottom electrodes (510, 520).

The left electrode (530) is only used to apply a programming voltage which is sufficient to generate an electrical field which alters the location of the p-dopants. There is no requirement for the left electrode (530) to apply a current to the memristive matrix (550). Consequently, the porous reservoir (557) may be made from non-conductive or conductive material.

Figure 6A:
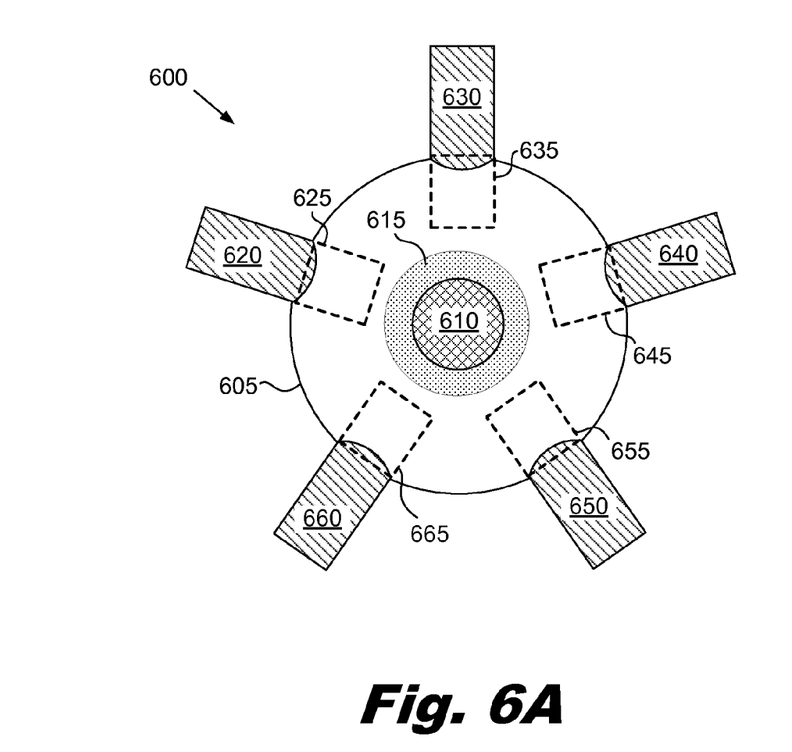
FIGS. 6A and 6B show an illustrative diagram of a multi-electrode memristive device which incorporates a central porous element, according to one embodiment of principles described herein.
Figure 6B:
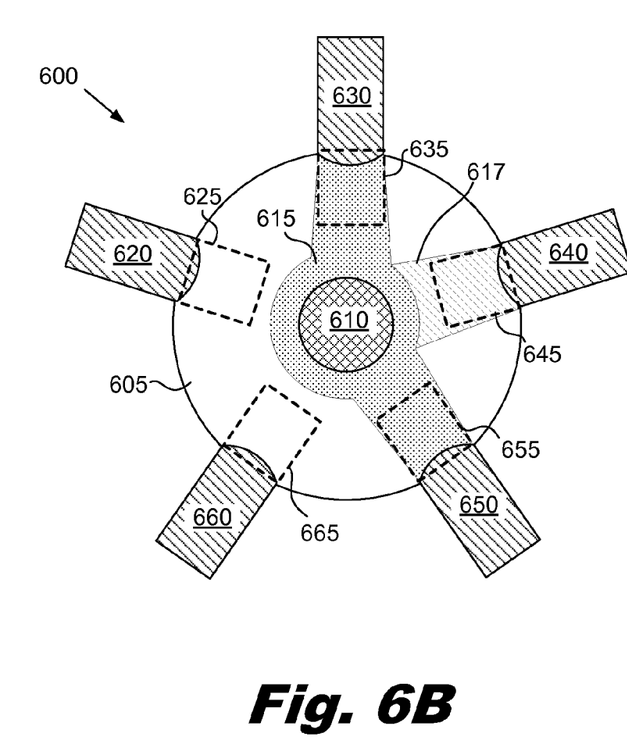

FIGS. 6A and 6B show an illustrative embodiment of a memristive rotary switch (600) with five signal electrodes (620, 630, 640, 650, and 660). The five signal electrodes are spaced around the perimeter of a memristive matrix (605) and are in electrical contact with the memristive matrix (605). Immediately in front of each of the signal electrodes, a programming electrode (625, 635, 645, 655, and 665) is positioned above or below the memristive matrix (605). The programming electrodes are shown as dashed boxes to prevent the obscuration of structures and regions beneath the programming electrodes. The programming electrodes (625, 635, 645, 655, and 665) are not in direct electrical contact with the memristive matrix (605), but are permanently separated from it by a thin insulating layer.

In the center of the rotary switch (600), a porous element (610) serves as a reservoir for one or more dopant species. Additionally, the porous element (610) may be made from a conductive material and be used as a programming or signal electrode.

FIG. 6A shows the rotary switch (600) in an "OFF" state, where each of the five signal electrodes (620, 630, 640, 650, and 660) are electrically isolated. The dopants (615) remain in the center of the center of the memristive matrix (605) surrounding the porous element (610). This configuration could be accomplished in a variety of ways. For example, this dopant distribution may be the original manufacturing configuration. Alternatively, this configuration could be accomplished using an electrical field created by applying voltage bias across the programming electrodes and central porous element (610) which draws the dopants (615) toward the central porous element (610). As discussed above, a variety of positive or negative dopants could be used within a memristive matrix. The direction, intensity, and duration of the applied electrical field could be tailored to the specific memristive material and dopant species.

FIG. 6B illustrates the programming of the rotary switch (600) to connect two specific electrodes (630, 650). To program the rotary switch (600), the programming electrodes (635, 655) above the selected signal electrodes (630, 650) are energized to draw a portion of the dopants (615) toward the signal electrodes (630, 650). This creates a conductive conduit from the signal electrodes (630, 650) to the central doped region. The signal or current can then pass through the conductive conduit, around the central doped region and down a second conductive conduit to the destination signal electrode.

Additionally, a second species of dopant (617) could be present in the porous electrode (610). In FIG. 6B, this second species of dopant is drawn toward a signal electrode (640) by a programming voltage applied to the programming electrode (645). As discussed above, this second species of dopant may have a different diffusion constant or require a different potential gradient to move. For example, the second species of dopant (617) may have required a lower potential gradient threshold and have a much slower diffusion rate than the first species (615). Consequently, the application of a relatively low programming voltage over a long duration would draw the second dopant species (617) toward the electrode (640) without dislocating the first dopant species (615).

Figure 7:
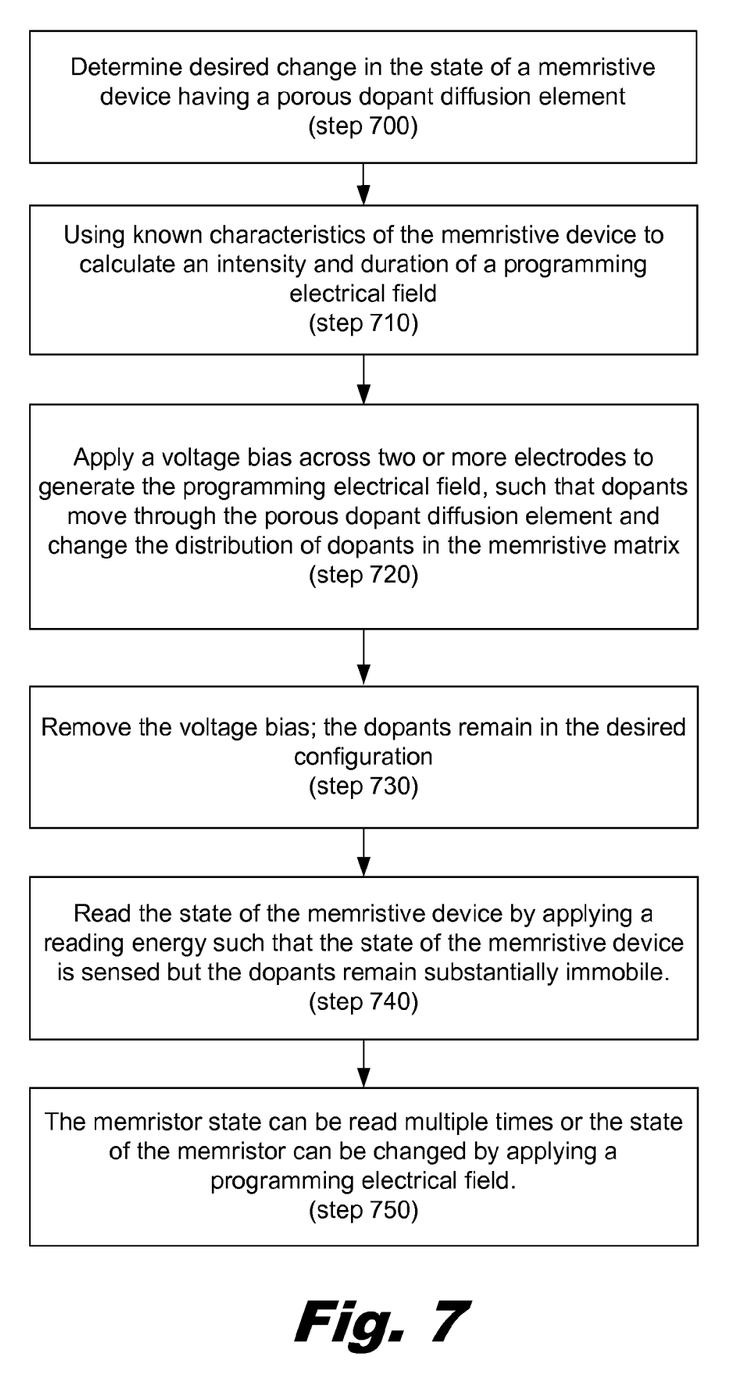
FIG. 7 is a flowchart which describes an illustrative method for utilizing a memristive device having a porous dopant diffusion element, according to one embodiment of principles described herein.

FIG. 7 is a flowchart describing one illustrative method for using a memristive device having a porous dopant diffusion element. In a first step, a desired change in the state of a memristive device is determined (step 700). For example, it may be desirable to distribute dopants contained within a porous layer into the memristive matrix. Alternatively, it may be desirable to drive dopants from a first portion of a memristive matrix through the porous layer and into a second portion of the memristive matrix. After the desired state has been determined, the known characteristics of the memristive device are used to calculate the intensity and duration of a programming electrical field (step 710). The programming electrical field is generated by applying a voltage bias across two or more electrodes (step 720). The programming electrical field is applied over the calculated duration and causes the dopants to move through the porous dopant diffusion element and changes the distribution of dopants in the memristive matrix to generate the desired state The programming electrical field is then removed and the dopants remain in the desired configuration and maintain the desired state (step 730).

The state of the memristive device can then be read by applying a reading voltage or current (step 740). The reading voltage or current is typically chosen such that it does not produce significant motion of the dopants within the memristive matrix and leaves the state of the memristive device unchanged. Consequently, the state of the memristive device can be read multiple times over an extended time period or the state of the memristive device can be altered by apply a programming electrical field (step 750).

In sum, a porous dopant diffusion element can improve the performance of a memristive device by promoting more uniform dopant distributions within the memristive device. Increased dopant uniformity can enhance the electrical differences between two or more device states. Additionally or alternatively, the porous dopant diffusion element can serve as a dopant reservoir for one or more species of dopants. This allows for increased flexibility in memristive device design and performance.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memristive device comprising:
   a first electrode;
   a second electrode;
   a memristive matrix interposed between said first electrode and said second electrode;
   a porous dopant diffusion element in physical contact with said memristive matrix and in proximity to at least one of said first electrode and said second electrode; and
   a first mobile dopant species, said first mobile dopant species moving through said porous dopant diffusion element in response to a programming electrical field generated by said first electrode and said second electrode, said programming electrical field altering a distribution of said first mobile dopant species within said memristive matrix.

2. The device of claim 1, wherein said porous dopant diffusion element is comprised of one of more of: a natural zeolite, a synthetic zeolite, a nanotube array, porous alumina, porous silica, porous titanium dioxide and porous carbon.

3. The device of claim 1, wherein said porous dopant diffusion element is electrically insulating.

4. The device of claim 1, wherein said porous dopant diffusion element is electrically conductive.

5. The device of claim 1, wherein said porous dopant diffusion element serves as a reservoir for one or more dopant species.

6. The device of claim 1, wherein said porous dopant diffusion element increases uniformity of dopant diffusion throughout said memristive matrix.

7. The device of claim 1, wherein said porous dopant diffusion element transects said memristive matrix, thereby separating said memristive matrix into a first region and a second region.

8. The device of claim 1, further comprising a second mobile dopant species, said second mobile dopant species having different diffusion characteristics from said first mobile dopant species.

9. The device of claim 8, wherein said porous dopant diffusion element influences said first mobile dopant species differently than said second mobile dopant species.

10. The device of claim 8, wherein said second dopant species is distributed throughout said memristive matrix and is substantially immobile within said memristive matrix at operating temperatures.

11. The device of claim 10, wherein said first mobile dopant species is drawn into said memristive matrix to create a transistor.

12. The device of claim 1, wherein three or more electrodes are configured to apply said programming electrical field.

13. A memristive device comprising:
   a first electrode;
   a second electrode;
   a titanium dioxide memristive matrix interposed between said first electrode and said second electrode;
   a porous dopant diffusion element, said porous dopant diffusion element comprising titanium dioxide nanotubes and being in physical contact with said titanium dioxide memristive matrix and in proximity to said first electrode and said second electrode; and
   a first mobile dopant species, said first mobile dopant species moving through said porous dopant diffusion element in response to a programming electrical field generated by applying a voltage bias across said first electrode and said second electrode; said programming electrical field altering a distribution of said first mobile dopant species within said titanium dioxide memristive matrix.

14. A method for using a memristive device having a porous dopant diffusion element comprising:
applying a voltage bias between a first electrode and a second electrode to generate a programming electrical field such that dopants move through said porous dopant diffusion element, thereby changing a distribution of dopants within a memristive matrix to form a first state;
removing said voltage bias, said dopants being substantially immobile in an absence of said programming electrical field; and
applying a reading energy to said memristive device to sense said first state.

15. The method of claim 14, further comprising reconfiguring said dopants by applying a second programming electrical field, said second programming electrical field causing said dopants to move within said porous dopant diffusion element, thereby changing a distribution of said dopants within said memristive matrix to form a second state.

16. The device of claim 1, wherein said memristive matrix surrounds said porous dopant diffusion element which is located at a center of a rotary switch, said first and second electrodes being disposed with at least one other electrode around a periphery of said rotary switch.

17. The device of claim 16, wherein said porous dopant diffusion element is electrically conductive so as to serve as a programming electrode in forming a conductive path through said memristive matrix between said porous dopant diffusion element and one of said electrodes disposed around the periphery of said rotary switch.

18. The device of claim 16, wherein said porous dopant diffusion element comprises a second mobile dopant species for selective diffusion into said memristive matrix.

19. The device of claim 8, wherein first mobile dopant species passes more readily through said porous dopant diffusion element than does said second mobile dopant species.

* * * * *